(12) United States Patent
Johnson

(10) Patent No.: US 8,125,011 B2
(45) Date of Patent: Feb. 28, 2012

(54) VERTICAL CELL EDGE JUNCTION MAGNETOELECTRONIC DEVICE FAMILY

(75) Inventor: Mark B Johnson, Potomac, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 111 days.

(21) Appl. No.: 12/622,366

(22) Filed: Nov. 19, 2009

(65) Prior Publication Data

US 2010/0148288 A1     Jun. 17, 2010

Related U.S. Application Data

(60) Provisional application No. 61/116,040, filed on Nov. 19, 2008.

(51) Int. Cl.
*H01L 29/76* (2006.01)
(52) U.S. Cl. ............ 257/295; 257/5; 257/300; 257/306; 257/E29.323
(58) Field of Classification Search .............. 257/5, 295, 257/365, 300, 306
See application file for complete search history.

(56) References Cited

U.S. PATENT DOCUMENTS

| 6,769,170 | B1 | 8/2004 | Shimazawa et al. | |
|---|---|---|---|---|
| 6,847,072 | B2 * | 1/2005 | Braun | 257/295 |
| 2003/0151857 | A1 * | 8/2003 | Kishi | 360/321 |
| 2004/0012895 | A1 | 1/2004 | Drewes et al. | |
| 2004/0257192 | A1 | 12/2004 | Mori et al. | |
| 2006/0158927 | A1 | 7/2006 | Johnson | |
| 2007/0188937 | A1 * | 8/2007 | Carey et al. | 360/324.1 |

OTHER PUBLICATIONS

M. Johnson and R. H. Silsbee, Phys. Rev. Lett. 55, 1790 (1985).
X. Lou et al., Nat. Phys. 3, 197 (2007).
D. Saha, et al., Appl. Phys. Lett. 89, 142504 (2006).
S. O. Valenzuela and M. Tinkham, Appl. Phys. Lett. 85, 5914 (2004).
W. H. Butler et al., Phys. Rev. B 56, 14574 (1997).
M. D. Stiles, J. Appl. Phys. 79, 5805 (1996).
K. Xia et al., Phys. Rev. B 73, 064420 (2006).
M. Johnson, IEEE Trans. Elec. Dev. 54, 1024 (2007).
M. Heiblum et al. IEEE J. Quant. Elec. 14, 159 (1978).
T. Kimura et al., Phys. Rev. B 72, 014461 (2005).
S. Garzon et al., Phys. Rev. Lett. 94, 176601 (2005).
R. Godfrey and M. Johnson, Phys. Rev. Lett. 96, 136601 (2006).
T. Kimura et al., Phys. Rev. Lett. 100, 066602 (2008).
M. Johnson and R. H. Silsbee, Phys. Rev. B 76, 153107 (2007).
J. Jorzick et al., Phys. Rev. Lett. 88, 047204 (2002).
B. B. Maranville et al., J. Appl. Phys. 99, 08C703 (2006).

* cited by examiner

*Primary Examiner* — Wai Sing Louie
(74) *Attorney, Agent, or Firm* — Amy L. Ressing; Kerry L. Broome

(57) ABSTRACT

Magnetoelectronic devices are fabricated by joining the edge of one ferromagnetic thin film element with the top, or bottom, portion of a second ferromagnetic, or nonmagnetic, thin film element. The devices also employ a new operational geometry in which the transport of bias current is in the film plane of at least one of the thin film elements, but is substantially perpendicular to the film plane of at least one of the thin film elements. Additionally, any of the variety magnetoelectronic devices (e.g., current-in-plane spin valves, current-perpendicular-to-the-plane spin valves, magnetic tunnel junctions, and lateral spin valves can be fabricated using these features.

6 Claims, 10 Drawing Sheets

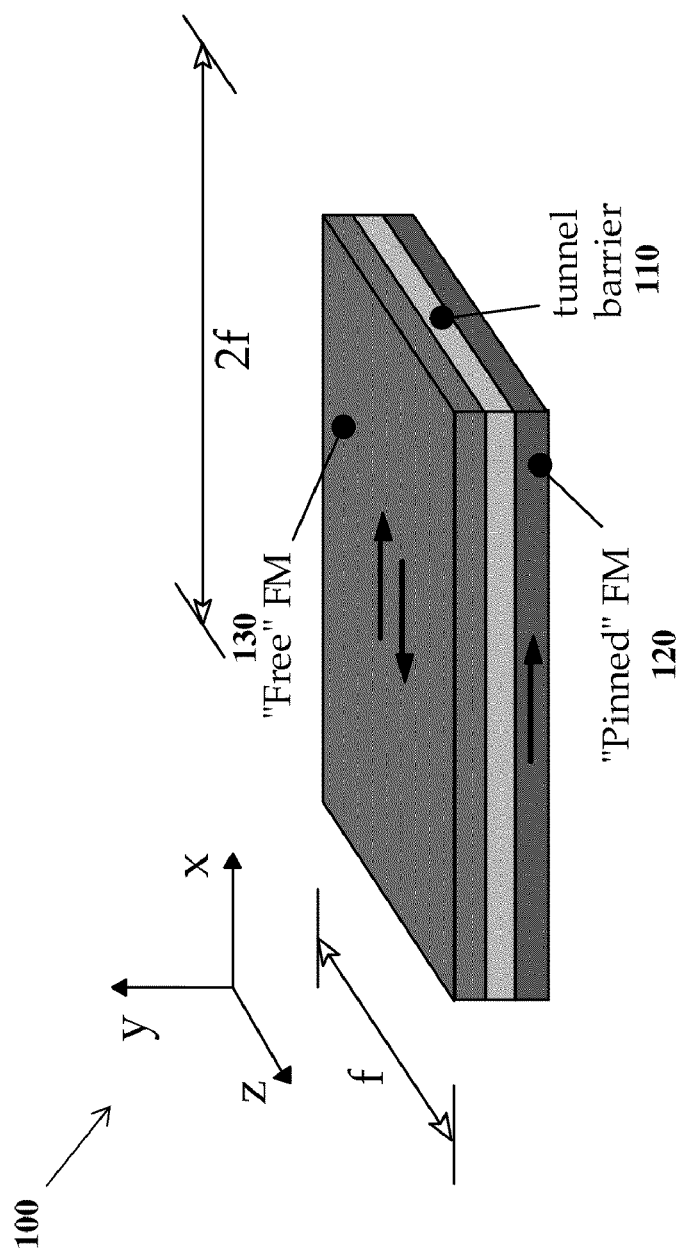
Figure 1A – Prior Art

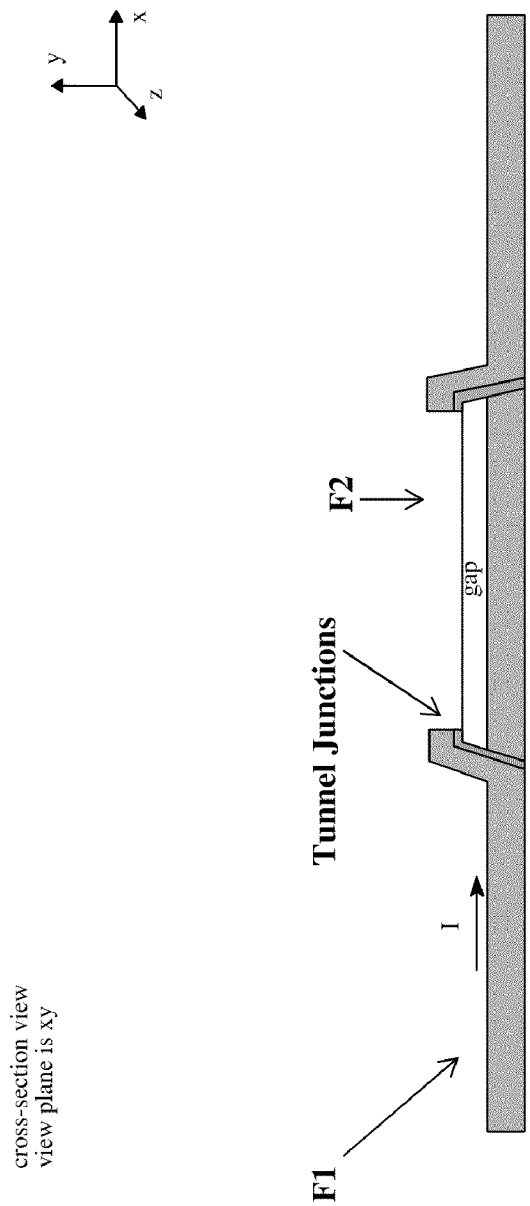
Figure 1B – Prior Art

Figure 5 – Prior Art

VERTICAL CELL EDGE JUNCTION MAGNETOELECTRONIC DEVICE FAMILY

CROSS-REFERENCE TO RELATED APPLICATIONS

This application claims priority to provisional patent application entitled, "Vertical Cell Edge Junction Magnetoelectronic Device Family," filed on Nov. 19, 2008, and assigned U.S. Application No. 61/116,040; the entire contents of which are hereby incorporated by reference.

FIELD OF THE INVENTION

The invention relates generally to magnetoelectronic devices. More specifically, the invention relates to a new topology and a new geometry that can be applied to magnetoelectronic device families.

BACKGROUND

The major magnetoelectronic device families are current-in-plane (CIP) spin valves, current-perpendicular-to-the-plane (CPP) spin valves, and magnetic tunnel junctions (MTJ). The lateral spin valve (LSV) is a minor device family. These devices have found technological success in at least two categories of applications. The first category is described as magnetic field sensors. The primary application is the sensor in a read-back head for magnetic media storage systems, such as hard disk drives (HDD). Other applications include position sensors and motion sensors. The second category is described as integrated electronics. The primary application is the storage element in a nonvolatile magnetic random access memory (MRAM). Other applications include nonvolatile switches for reprogrammable logic circuits.

Thin ferromagnetic film devices are generally of the form F1/N/F2. Such devices are often called magnetoelectronic devices. F1 and F2 are ferromagnetic materials, and each can be a single layer or a multilayer. N can be a nonmagnetic material (typically a metal), in which case the device is a spin valve, or it can be a low transmission barrier (typically a dielectric tunnel barrier), in which case it is a magnetic tunnel junction. The devices have two dominant applications: (i) a magnetic field sensor, as used in the read-back head in a magnetic media hard disk drive; (ii) a storage cell in an integrated, nonvolatile magnetic random access memory (MRAM).

The area on a chip that is used by a device is given in units of the minimum lithographic feature size, f. For example, with few exceptions (discussed below in reference to prior art), all the magnetoelectronic devices have a planar geometry. Spin valves and MTJs use a sandwich geometry. The ferromagnetic (F), nonmagnetic and/or dielectric tunnel barrier layers (N) are fabricated as a sandwich in the plane of the wafer. The chip area of these devices is given by the product of the lateral dimensions, the length and width of the sandwich. For example, a CPP spin valve or MTJ using a sandwich shaped like an ellipse and having width 1f and length 2f would have an area on the chip of $2f^2$. Leads attach the sandwich using the top and bottom surfaces and do not add additional area. A CIP spin valve might require additional area for attaching the leads; thus, such a device might have an area on the chip of $4f^2$. The lateral spin valve is fabricated with the ferromagnetic and nonmagnetic material layers in the plane of the wafer, but the layers are spatially separated and are not in registration as would be the case for a sandwich geometry. Typically F1 and F2 are fabricated with width f and separated by f, and additional length 2f is required to attach leads. It follows that a typical lateral spin valve might use an area of $5f^2$ on a chip surface.

Geometry

For convenience, the coordinate axes for a chip can be labeled such that the surface is the xz plane and y is normal to the surface of the chip. Typically, the devices are built up as layered structures with each layer on top of the other. The layers are usually thin films with relatively small thickness in the y direction, but having lateral extent in the xz plane. A common convention is to treat the layer as nearly two dimensional, and to say that the plane of the layer is the xz plane. For the lateral spin valve all layers are in the xz plane, but are not stacked in registration, one upon the other. Spin valves and MTJs have a sandwich structure in which each layer is stacked, in registration, upon another layer.

FIG. 1A is a perspective view of a prior art magnetic tunnel junction 100. The figure shows a rectangular sandwich structure with shape anisotropy ratio of 2:1. More generally, the devices have the shape of an ellipse and the shape anisotropy may vary from 1:1 to 5:1. FIG. 1A could also depict a prior art CPP spin valve if the "middle" layer 110 is taken to be a thin nonmagnetic metal film.

Operation

Magnetoelectronic devices are generally considered to be magnetoresistive devices. The structure can be characterized by an electric resistance, and the value of the resistance differs according to the two different conditions (device states) in which the magnetizations M1 and M2 of F1 and F2 are either parallel or anti-parallel. Typically the device state with M1 and M2 parallel has low resistance R, and the state with M1 and M2 anti-parallel has high resistance $R+\Delta R$. The relative change of resistance is called the magnetoresistance ratio, or simply the magnetoresistance, $MR=\Delta R/R$. Note that the lateral spin valve has the opposite convention: the state with M1 and M2 parallel has relatively high resistance $R+R_S$, the state with M1 and M2 anti-parallel has relatively low resistance $R-R_S$, and R is a baseline resistance with a value determined by details of the geometry. Also note that typically one of the magnetizations is pinned in a fixed direction. This is called the pinned layer. The second magnetization is called the free layer. The magnetization states described as parallel or anti-parallel are now determined by the orientation only of the free layer.

The device parameters are typically (i) applied bias current, (ii) measured voltage, and (iii) external magnetic field. In other cases, (i) a bias voltage is supplied, (ii) a current is measured, and the magnetization of the free layer may be controlled (iii) by applying a spin polarized current to the free layer, instead of using an external magnetic field.

Two device families are recognized and are distinguished by the flow direction of bias current (or, less common, voltage). In a prior art current-in-plane (CIP) spin valve, the F1/N/F2 spin valve is typically fabricated with all layers in the xz plane and stacked in a sandwich geometry. The bias current is applied such that it flows in the xz plane, for example along x, and the resistance is measured along x. In a current-perpendicular-to-the-plane (CPP) spin valve, the spin valve is typically fabricated with all layers in the xz plane and stacked in a sandwich geometry. The bias current is applied such that it flows perpendicular to the xz plane, along y, and the resistance is measured along y, for example from the top to the bottom of the sandwich stack. The MTJ is a CPP device. A bias current is supplied by applying a bias voltage from the bottom electrode (e.g., F1) to the top (F2). The tunnel barrier has a high electrical resistance, the dominant voltage drop is across the barrier, and the bias current is driven to flow with a direction perpendicular to the barrier and therefore perpendicular to the F1 and F2 layers.

Magnetization Manipulation

For sensor applications, fringe magnetic fields from bits recorded as domains in magnetic media change the magnetization orientation of the free layer and the device resistance then varies.

For MRAM, the free layer typically has a uniaxial anisotropy axis parallel to the axis of magnetization of the pinned layer 120. The free layer 130 is designed to have two stable magnetization states, parallel or anti-parallel with the magnetization orientation of the pinned layer 120, and the two different device resistances represent the two binary states, 0 and 1. The storage cell is designed to operate in an integrated way, and two separate mechanisms, Oersted Switching and Spin Torque Switching, are used to manipulate the magnetization orientation of the free layer 130.

In Oersted Switching, two integrated thin film wires (write wires) can be fabricated to be proximal with the device (and, in particular, with the free F layer 130). Current pulses in these wires are inductively coupled to the device, thereby applying pulses of local magnetic field. For appropriate magnitudes, these field pulses superpose in a way that sets the magnetization state of the free layer 130 into a given state, while that of the pinned layer 120 remains fixed. Reversing the polarity of the "write current" pulses will set the magnetization of the free layer 130 into the opposite state. Since the memory cells are formed in a two-dimensional array, the write wires are also formed as a two dimensional array. Write wires pass along rows or columns of cells. Pulses in two write wires that intersect at a given cell uniquely set the magnetization state of that cell, while other cells along the row or column are not affected. This is called "half-select" switching. "Toggle switching" is a pulse sequence that is more complicated, but also relies on Oersted switching with a two dimensional array of write wires.

In Spin Torque Switching, a spin polarized current driven into a thin, patterned ferromagnetic film applies a torque on the magnetization. Pulses of spin polarized current, with positive or negative polarity, can be used to set the magnetization of the free layer 130 into one or the other state.

Edge Junctions

Tunnel junctions are commonly fabricated between two superconductors. In the field of superconductivity, a structure with two superconducting films, e.g. in the xz plane, and a tunnel junction between the two films is called a planar junction. It is also common to fabricate a tunnel junction that contacts one of the films at the film edge. In other words, one superconducting film (S1) is taken to have lateral extent in the xz plane and thickness along y. An insulating layer can be fabricated on the top surface of S1. One edge of S1 can be "cleaned," and a second film S2 can be fabricated, also in the xz plane, overlapping the edge of S1. S1 and S2 are next to each other, contiguous in the xz plane, and typically a portion of S2 is on top of the insulating layer that coats the top surface of S1. This kind of tunnel junction is called an edge junction.

Magnetic Edge Junctions

Some prior art references describes tunnel junctions fabricated using the edge of one of the ferromagnetic layers, e.g. F1. These references describe magnetic tunnel junctions used for a sensor application. Similar to the edge junction used with superconducting films, F1 and F2 are next to each other, contiguous in the xz plane, and typically a portion of F2 is on top of the layer that coats the top surface of F1. In prior art references, this is called a gap layer, and is typically an insulating material (see e.g., FIG. 1B). FIG. 1B is a cross-section view of a prior art device. The references describe a sensor that has F2 in the middle, and has two tunnel junctions, one on each of the left and right edges. F1 is typically two separate ferromagnetic films, one overlapping the right edge of F2 and the other overlapping the left edge of F2. These devices are described as CIP structures: Film F2 is in the xz plane and both parts of F1 are in the xz plane, except for the small portions that overlap onto the top of the insulating layer above F2. These portions carry no current. Instead, the current is applied at one end of F2, travels in the plane (e.g. along x) and through the first junction, then through F1, then through the second junction, and finally through the second part of F2 at out the other end. The current is always in the xz plane.

The prior art device discussed in reference to FIG. 1B is relevant only to magnetic tunnel junctions (MTJs), where three distinctions can be drawn. First, in the prior art structure, the edge is not perpendicular to the plane of the substrate (equivalently, the plane of the top surface of film F2). The result of the etching process is an edge that slopes about 55 degrees from the normal direction (i.e. from the y axis as defined in the disclosure). The portion of F1 that makes contact with the tunnel barrier is in a plane that is not perpendicular to the substrate. By contrast, the plane is more nearly parallel (35 degrees from parallel) with the substrate plane than perpendicular (55 degrees from perpendicular). Second, the remainder of the film F1 is in a plane parallel to the substrate. Third, the magnetization orientations of both F1 and F2 lie along an axis that's in the plane of the substrate (x axis as defined in the disclosure). It should be noted that other prior art also described junctions with edges that were not substantially perpendicular to the substrate plane.

A prior art reference describes a sandwich structure in which the flow of the bias current is promoted to be perpendicular to the plane of the films in a portion of the device, and parallel to the plane of the films in different portion(s) of the device. All films are in the xz plane and current flow is not homogeneous.

A prior art reference describes a magnetic edge tunnel junction with a single tunnel barrier. A bottom ferromagnetic layer, F2, is fabricated with an insulating film (I) on the top surface forming a bilayer (actually a trilayer because a third, thin layer is deposited between F2 and I). A photoresist mask and an Ar ion mill are used to expose one edge of F2, and a tunnel barrier is grown at the exposed edge. Finally a second ferromagnetic layer, F1, is deposited on top of the bilayer. The film F1 extends across the exposed edge of F2.

BACKGROUND SUMMARY

In summary, technological trends require that devices should be designed and fabricated to use smaller areas as time increases. One way in which this is achieved is that a lithographic feature size decreases at a rate permitted by lithographic processing technology. A second way in which this can be achieved is when devices are redesigned to have geometries that require smaller areas on the chip.

Accordingly, there remains a need for a device and a method to manufacture a device that is characterized by a new topology and a new geometry, features which result in devices that require substantially smaller areas than prior art references discussed above. The novel topology and geometry can be applied to all the magnetoelectronic device families, in particular the CPP spin valve, the MTJ and the LSV.

SUMMARY OF THE INVENTION

In contrast to traditional magnetoelectronic devices, the present invention draws at least two distinctions—one of topology and one of operational geometry. Conventional magnetoelectronic devices are typically sandwich structures in which all the films are fabricated to be in the same plane. The novel magnetoelectronic devices discussed herein disclose joining the edge of one ferromagnetic thin film element with the top (or bottom) portion of a second ferromagnetic (or nonmagnetic) thin film element. The novel devices can also employ a new operational geometry, in which the transport of bias current is in the film plane of at least one of the thin film elements, but is substantially perpendicular to the film plane of at least one of the thin film elements. Additionally, any of the variety magnetoelectronic devices (e.g., current-in-plane (CIP) spin valves, current-perpendicular-to-the-plane (CPP) spin valves, magnetic tunnel junctions (MTJ), and lateral spin valves (LSV) can be fabricated using the topology discussed.

These and other aspects, objects, and features of the present invention will become apparent from the following detailed description of the exemplary embodiments, read in conjunction with, and reference to, the accompanying drawings.

BRIEF DESCRIPTION OF THE DRAWINGS

FIG. 1A is a perspective view of a prior art magnetic tunnel junction.

FIG. 1B is a cross-sectional view of a prior art magnetoelectronic device.

DETAILED DESCRIPTION OF EXEMPLARY EMBODIMENTS

Figure 2:
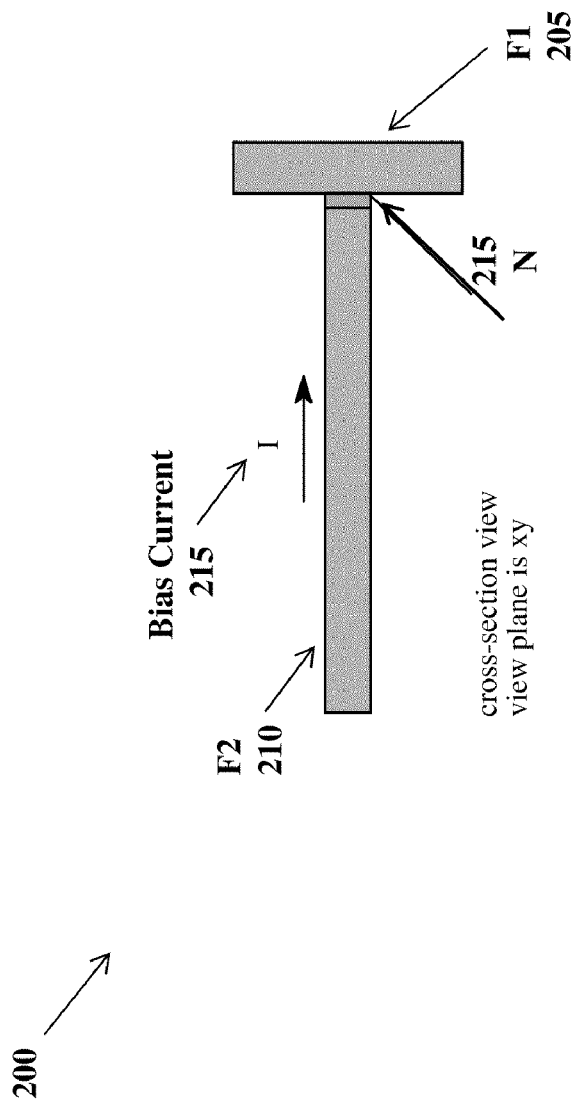
FIG. 2 is a cross-sectional view of a magnetoelectronic device in accordance with an exemplary embodiment of the invention.

Referring now to the drawings, in which like numerals represent like elements, aspects of the exemplary embodiments will be described in connection with the drawing set.

In accordance with an exemplary embodiment of the invention, a different kind of magnetoelectronic device can be made using a structure having a different topology and different geometry. This device family, which can be called "edge junction spin valves," can be fabricated as a vertical cell and can have several advantages over traditional magnetolectronic devices. In addition, the device family can be applied to at least three families of magnetoelectronic devices: lateral spin valves (LSV), CPP spin valves, and magnetic tunnel junctions (MTJs).

FIG. 2 is a cross-sectional view of a novel magnetoelectronic device 200, in accordance with an exemplary embodiment of the invention. F2 210 can be a ferromagnetic film fabricated with lateral extent in the xz plane and thickness along y. Pinned layer F1 205 can be a ferromagnetic film with lateral extent in the yz plane and thickness along x.

In contrast to traditional magnetoelectronic devices, the first distinction is one of topology. Conventional magnetoelectronic devices are typically sandwich structures in which all the films are fabricated to be in the same plane. By contrast, the device 200 can use one ferromagnetic layer substantially in the xz plane and a second ferromagnetic layer substantially in the yz plane. It should be understood to one of ordinary skill in the art that each ferromagnetic layer may be composed of a single thin film, or of multiple layers of films.

The second distinction is one of operation. The bias current 215 is parallel to the plane of F2 210 when it is in F2 210, crosses the interface 215 with a direction perpendicular to the plane of F1 205, and is typically drained from F1 205 after traversing a portion of F1 205 with direction in the film plane. Since the transport effects that cause magnetoresistance occur near the interface, the bias current in that region is parallel to the plane of one component film but perpendicular to the plane of the second component film. At the interface 215, also labeled N, there is typically a thin tunnel barrier or a thin nonmagnetic metal.

Figure 3:
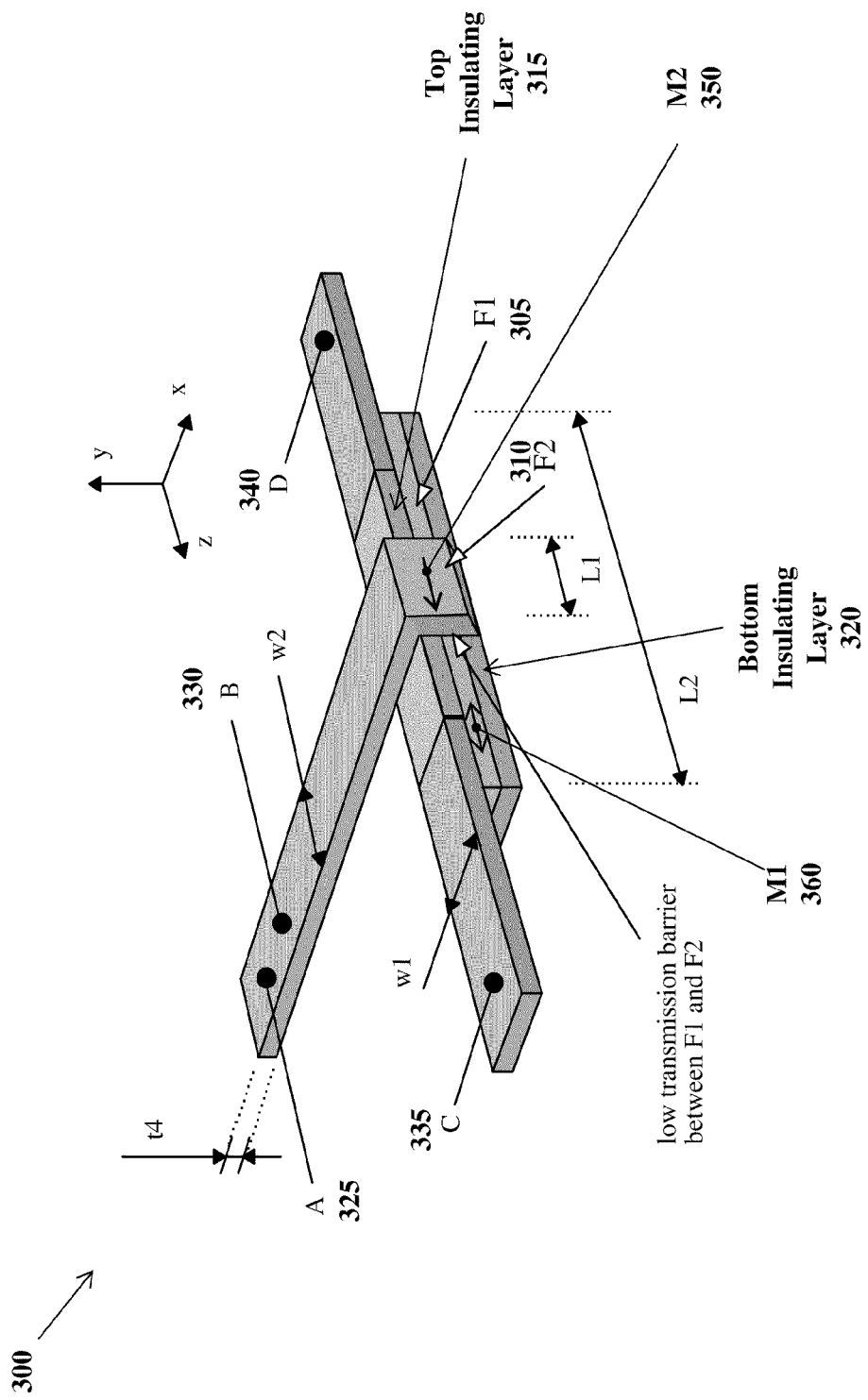
FIG. 3 is a perspective view of a magnetoelectronic device in accordance with an exemplary embodiment of the invention.

Any of the variety magnetoelectronic devices can be fabricated using the topology discussed with reference to FIG. 2. FIG. 3 is a perspective view of a magnetoelectronic device 300 in accordance with an exemplary embodiment of the invention. To accomplish this, it is typically preferred to fabricate an insulating layer 315 on top of F1 305 so that F2 310 can overlap the edge of F1 305 and make electrical contact to F1 305 only at the edge. It is also typically preferred to have an insulating layer 320 underneath F2 310 so that F1 305 can be fabricated as a continuous smooth layer in the vicinity of the edge.

In reference to FIG. 3, a magnetic tunnel junction can be formed if a low transmission (tunnel) barrier is fabricated between F1 305 and F2 310. Furthermore, a spin valve can be formed if F1 305 is deposited as a bilayer composed of a thin nonmagnetic metal (N) and a second ferromagnetic layer (F). For the desired case where F is pinned, another layer may be provided to promote magnetization pinning of M2. The spin valve can be expected to have the transport characteristics of a current-perpendicular-to-the-plane spin valve.

In a preferred embodiment for an MRAM storage cell, and in reference to FIG. 3, the magnetization M2 can be pinned (represented by the arrow in the z axis on F2 310), e.g. along the z axis, and F1 305 is fabricated to have a uniaxial anisotropy axis along z. For the MRAM application, the state of the cell can be determined ("read") by measuring the magnetoelectronic device resistance. For example, in a 4-probe measurement current can be biased from A 325 to C 335 and voltage measured from B 330 to D 340. A 2-probe measurement could also be used. The state of the cell can be set ("written") by sending current pulses of positive or negative polarity from C 335 to D 340. Such a pulse would change the magnetization state M1 by, for example, moving a domain wall from one end of F1 305 to the other. A preferred embodiment might include a geometric asymmetry at one end, or both ends, of F1 305 to promote the nucleation and/or pinning of a domain wall.

In a preferred embodiment for a sensor application, the magnetization orientation M2 typically also is pinned, for example along the z axis. Free layer F1 305 may be fabricated with an anisotropy axis along the x direction, such that the magnetization state of the device in zero magnetic field has M1 and M2 neither parallel nor anti-parallel. Fringe magnetic fields then cause the orientation of M1 to shift from perpendicular to M2 to states having components that are either parallel or anti-parallel with M2.

Figure 4:
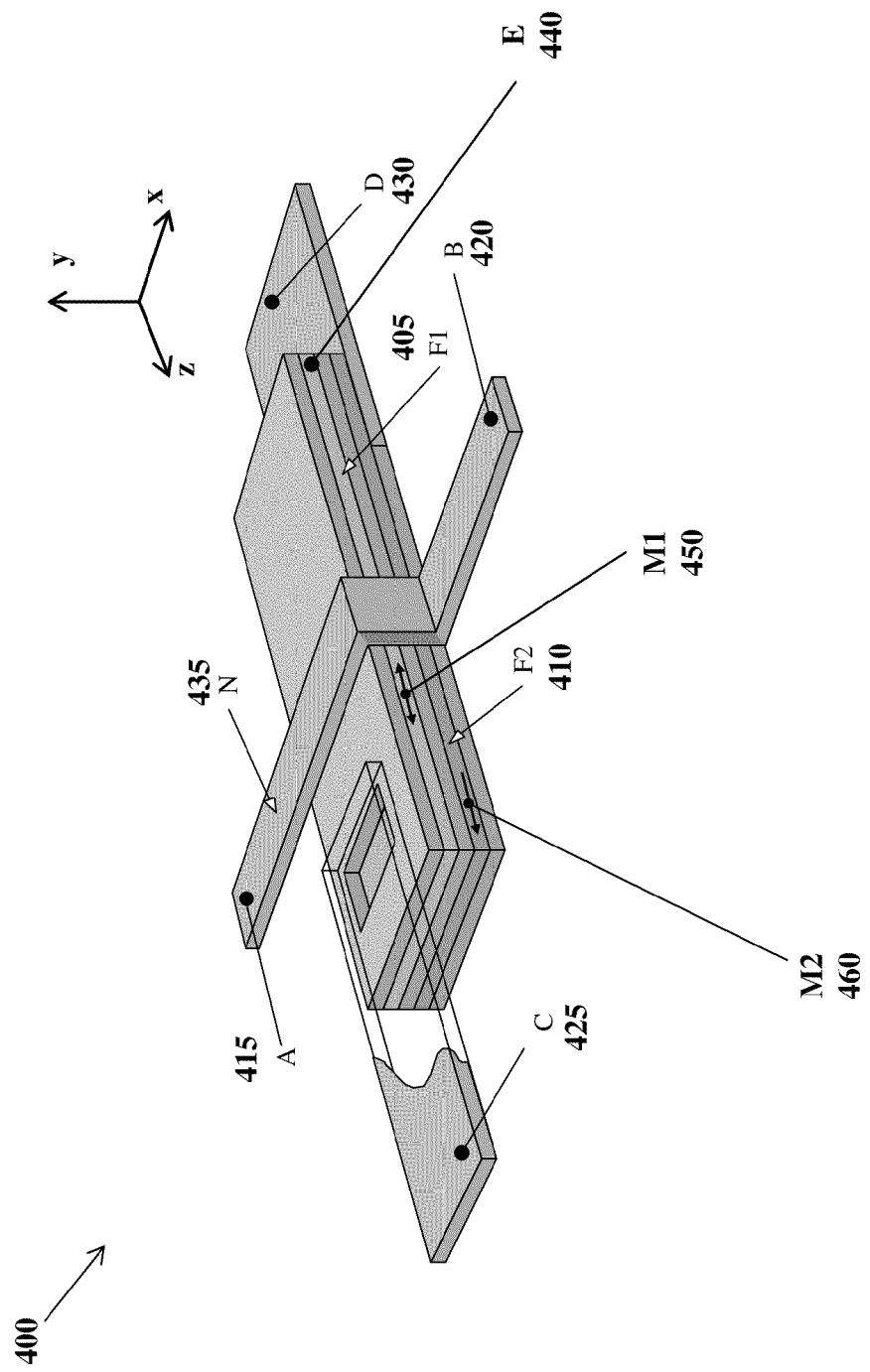
FIG. 4 is another perspective view of a magnetoelectronic device in accordance with an exemplary embodiment of the invention.

FIG. 4 is another perspective view of a magnetoelectronic device 400 in accordance with an exemplary embodiment of the invention. A lateral spin valve can be formed if two ferromagnetic layers are fabricated on top of each other, each having lateral extent in the xz plane, separated by a thin insulating layer. The magnetization of one layer, for example M2 460, may be pinned and that of the other layer (e.g. M1 450) is then fabricated with a uniaxial anisotropy axis and the orientation is "free" to align parallel or anti-parallel with M2. Alternatively, both F1 405 and F2 410 may be fabricated with parallel uniaxial anisotropy axes and one of the ferromagnetic layers, e.g. F2 410, may be fabricated to have a large coercivity. The other layer (e.g. F1 405) is fabricated with a relatively small coercivity. The magnetization M2 460 is then the reference layer and the magnetization of all cells is polled and set in one direction. M1 450 is free to align parallel or anti-parallel with M2 460. A device state can be read by providing current from A 415 to D 430 and measuring voltage from C 425 to A 415. The state can be written using Oersted switching and integrated write wires. Alternatively, a contact E 440 can be provided to F1 405 at the end of F1 405 opposite contact C 425. Current pulses from C 425 to E 440 would change the magnetization orientation M1 450 by moving a domain wall, in a manner similar to that described above.

In reference to FIGS. 2, 3, and 4 described above, the novel magnetoelectronic devices can be summarized as employing a new topology, specifically joining the edge of one ferromagnetic thin film element with the top (or bottom) portion of a second ferromagnetic (or nonmagnetic) thin film element. The novel devices can also employ a new operational geometry, in which the transport of bias current is in the film plane of at least one of the thin film elements, but is substantially perpendicular to the film plane of at least one of the thin film elements. A domain wall in a ferromagnetic material film typically has thickness on the order of 10 nm. A lithographically patterned ferromagnetic film has an edge with irregularities (roughness) typically on the order of 10 nm. It follows that the magnetization at the edge is not generally expected to be uniformly the same as the magnetization in the interior of the film, remote from the edge. By contrast, the magnetization may be expected to form small domains at the edge. If that were the case, spin polarized current at the edge would not have a character related to the magnetization in the interior. Following this observation, there is no reason to expect that a spin transport device (spin valve, MTJ or lateral spin valve) would function properly using bias current that flows out of an edge. The novel magnetoelectronic devices described herein are based on the novel concept that the magnetization near the edge of a patterned ferromagnetic thin film element may in fact remain substantially parallel with the average magnetization of the element.

In contrast to the previously discussed prior art, the invention described herein discloses an edge junction that uses an edge of film F2 (see, e.g., FIG. 2). The plane of the edge is substantially perpendicular to that of the substrate. In one embodiment, good results have been obtained with structures that were etched to have edges at angles that ranged from 0 to 30 degrees relative to perpendicular (relative to the y axis). This means that the portion of F1 that is in contact with F2 is in a plane that is substantially perpendicular to the plane of F2 (equivalently, the substrate plane). In one embodiment, film F1 may be deposited in a way that a portion overlaps the top surface of a F2/I bilayer; however, that is not required, however. In an embodiment, film F1 may be fabricated to extend only over the edge surface, and not the top surface. Since F1 is in a plane substantially perpendicular to that of F2, the uniaxial magnetization axis of F1 generally will not be the x axis. More typically, the magnetization axis would be chosen to be z or y. In typical operation, the axis M1 of F1 would be z and the axis M2 of F2 would also be z.

The previous disclosure in reference to FIGS. 2, 3, and 4 describe two kinds of applications, a magnetic field sensor and a memory cell in a Magnetic RAM. In addition to these application, a specific application for magnetoelectronic edge junctions as a sensor that reads data stored in a "racetrack memory" can be described. The racetrack memory is conceptually similar to magnetic bubble memory, known to one of ordinary skill in the art.

Figure 5:
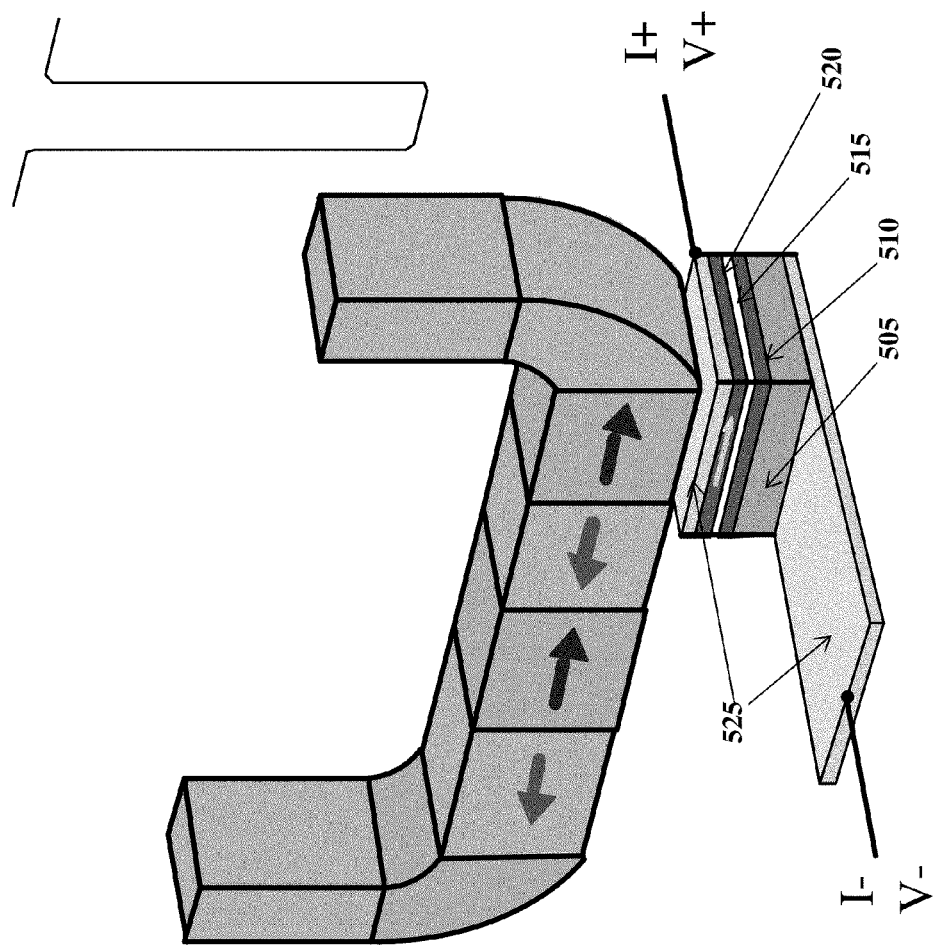
FIG. 5 is a perspective view of a prior art racetrack memory.

FIG. 5 is a perspective view of a prior art racetrack memory. Specifically, the prior art racetrack memory was obtained from drawings publicly available on International Business Machines (IBM) website. The figure represents the bottom portion of the racetrack, along with a prior art readout device proposed by an IBM development team. The racetrack itself is a thin wire of ferromagnetic material (metal) and is fabricated in a substrate trench. It typically has the hairpin shape shown at the upper right of the figure as an inset and not in proportion with FIG. 5. A write wire, in a separate region, orients a magnetic domain to point left or right, representing binary "1" or "0" respectively. A pulse of current applied from one end of the racetrack to the other causes the domains to move along the wire. During the write process the domains are moved synchronously with the creation of newly written domains. Once written, the pattern of domains is stored in a nonvolatile way.

In the readout process, a current or pulses of current drive the domains along the wire. In the bottom portion, a magnetic tunnel junction (MTJ) is fabricated in close proximity with the ferromagnetic wire. In the sketch, the region 505 represents a pinning layer, the layer 510 is the pinned ferromagnet, the region 515 is a low transmission tunnel barrier, the layer 520 is the free ferromagnetic layer, and the layers 525 are electrodes for delivering current and detecting voltage. As domains pass over the MTJ, fringe magnetic fields couple with the magnetization of the free ferromagnetic layer, causing its orientation to be either parallel or anti-parallel with that of the fixed layer so that the MTJ magnetoresistance is low or high. This readout process is nondestructive, meaning that the domain pattern is retained without damage.

A strength of the racetrack memory is that a high density of data storage can be achieved. The architecture uses a vertical cell with a large number of bits stored in each cell. A weakness of the racetrack memory is the readout process. The magnetic coupling between the fringe fields of a domain wall and the magnetization of the free layer of the sensor is weak, and readout has a relatively poor signal to noise and a relatively high error rate.

Figure 6:
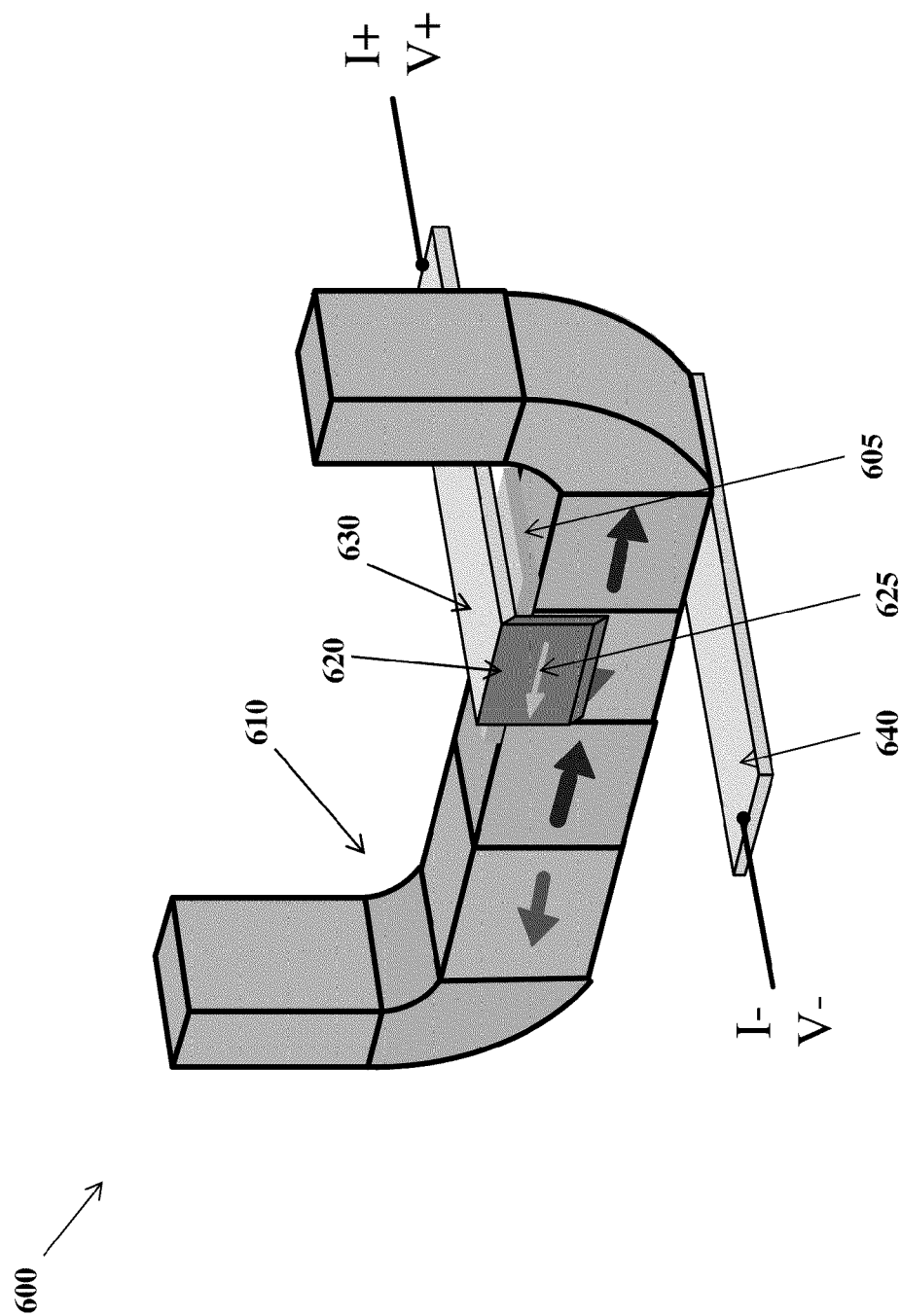
FIG. 6 is a perspective view of a racetrack memory in accordance with an exemplary embodiment of the invention.

FIG. 6 is a perspective view of a racetrack memory in accordance with an exemplary embodiment of the invention. FIG. 6 depicts an improved readout sensor that can be designed using an edge junction. An insulating layer 605 can fabricated on the top surface of the bottom portion of the racetrack wire 610. The edge junction is fabricated on one surface of the wire as a pinned ferromagnetic layer 620 with magnetization 625 orientation parallel to the axis of the wire. A thin film conducting wire 630 makes contact with the edge junction, and is used as a lead for providing bias current and for measuring voltage. A separate conducting layer 640 provides a second electrical contact and provides bias current ground and voltage reference.

The pinned ferromagnetic layer 620 used in the edge junction can be fabricated as a bilayer having a nonmagnetic (N)

metal at the interface, thereby forming a CPP spin valve. Alternatively, a low transmission, insulating (I) tunnel barrier can be fabricated between the pinned layer and the racetrack, thereby forming a tunnel junction. In either case, the racetrack wire 610 represents the free ferromagnetic layer of the edge junction device. Under constant current bias, the edge junction will generate a voltage that is relatively high (low) for a domain with magnetization orientation anti-parallel (parallel) with that of the pinned layer. This is a direct transport measurement of the domain orientations, and it has the advantage that it will have higher signal to noise and lower error rate by comparison with the prior art readout in FIG. 5 using the prior art MTJ stack pictured in FIG. 1A. It should be clear to one of ordinary skill in the art that the measurement could be made by providing a voltage bias and measuring a current.

One of ordinary skill in the art will also recognize that care must be taken when designing the electrical circuitry for the sensor of FIG. 6. A primary bias current, with relatively high current density, is applied from one end of the racetrack to the other and is used to move the domains during the read process. The electrical ground for secondary bias current in the sense circuit must be isolated from the electrical ground for the primary current. A variety of techniques can be used, including active and passive circuit elements, along with optimally chosen sensing frequencies.

The novel devices discussed herein offer several important features and advantages that apply to both sensor and integrated device (MRAM) applications. A first feature is the minimized device size. In the prior art, all devices are planar cells. For integrated applications, the chip area used by the cell is given by the product of the transverse dimensions. As discussed, the transverse dimensions are given in units of the minimum feature size, f. For example, an elliptical sandwich cell with dimensions if by 3f has area $3f^2$. This novel devices herein can minimize the area used on the chip because the cell can be fabricated as a "vertical cell," where the thickness of the films provides one dimension and the transverse extent provides the other. It is important to note that the thickness of the films is less than the minimum feature size.

Figure 7:
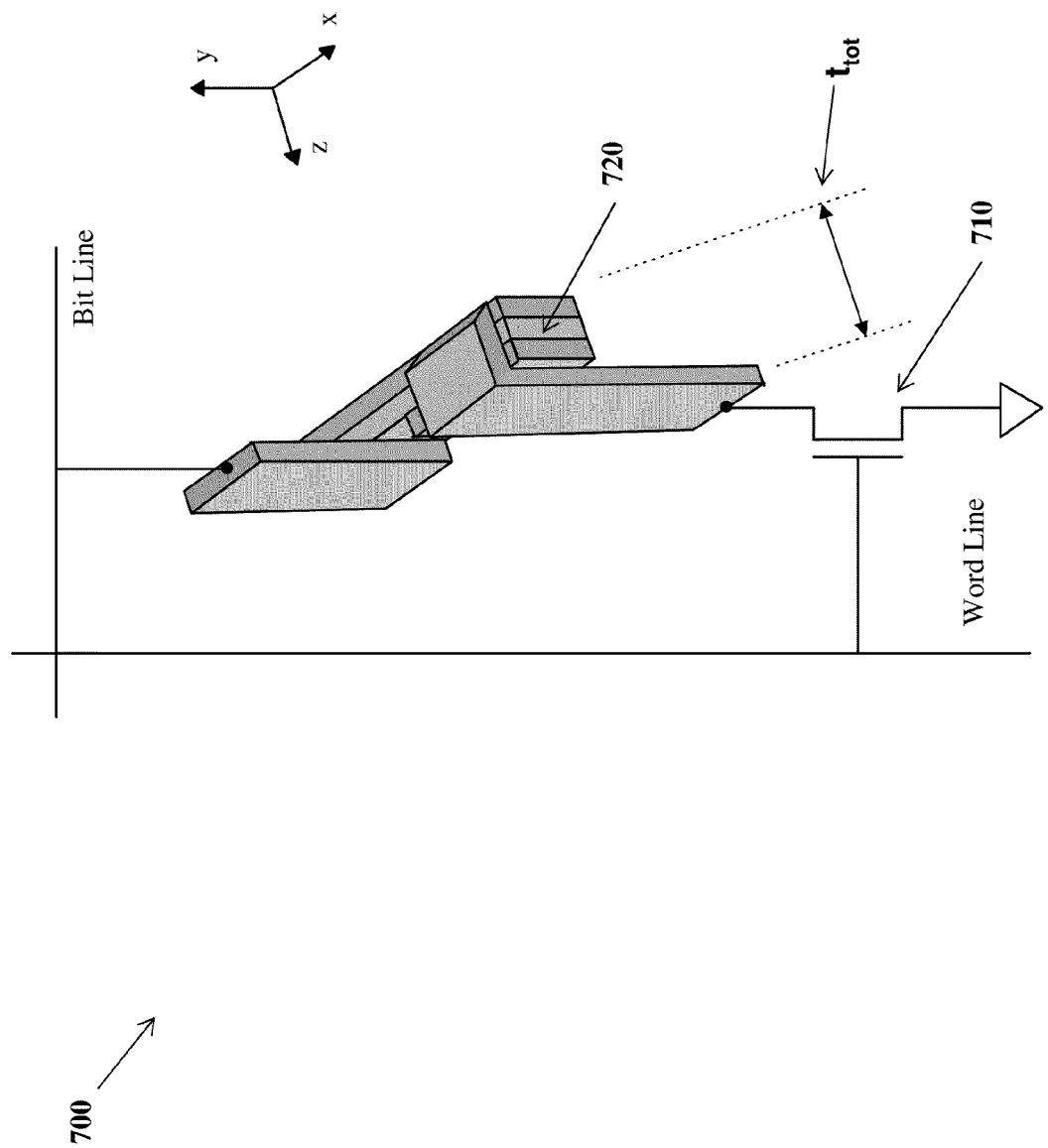
FIG. 7 is an example of a vertical MRAM cell in accordance with an exemplary embodiment of the invention.

FIG. 7 is an example of a vertical MRAM cell 700 in accordance with an exemplary embodiment of the invention. Similar to prior art MRAM cells, the cell is composed of the magnetoelectronic storage device and an FET 710 that is used to isolate the cell from the 2-dimensional array of cells. In FIG. 7 the chip surface is in the xz plane. This vertical cell therefore has an area given by the product of the length of F1 720 and the total thickness of the films, $t_{tot}$. As represented in FIG. 7, F1 has a length of 3f or less, and the thickness $t_{tot}$ is less than the minimum feature size, $t_{tot}$<f. Therefore the cell requires less area on the chip than a prior art planar cell. One of ordinary skill in the art should be aware that isolation FETs can be fabricated with transverse dimensions of 2f×1f, and the same techniques could be used to make a vertical storage cell that has 2f width and thickness $t_{tot}$. The important feature is that the area of the cell is determined by the FET, and this kind of vertical magnetoelectronic cell does not require any additional area for the cell. In this embodiment, the write process can be performed by a spin torque switching, sending a spin polarized current pulse (of one of two polarities) from the bit line to ground. The read process can use a two probe measurement of device resistance, measured from the bit line to ground and using a measuring current smaller than the spin torque write current.

Figure 8:
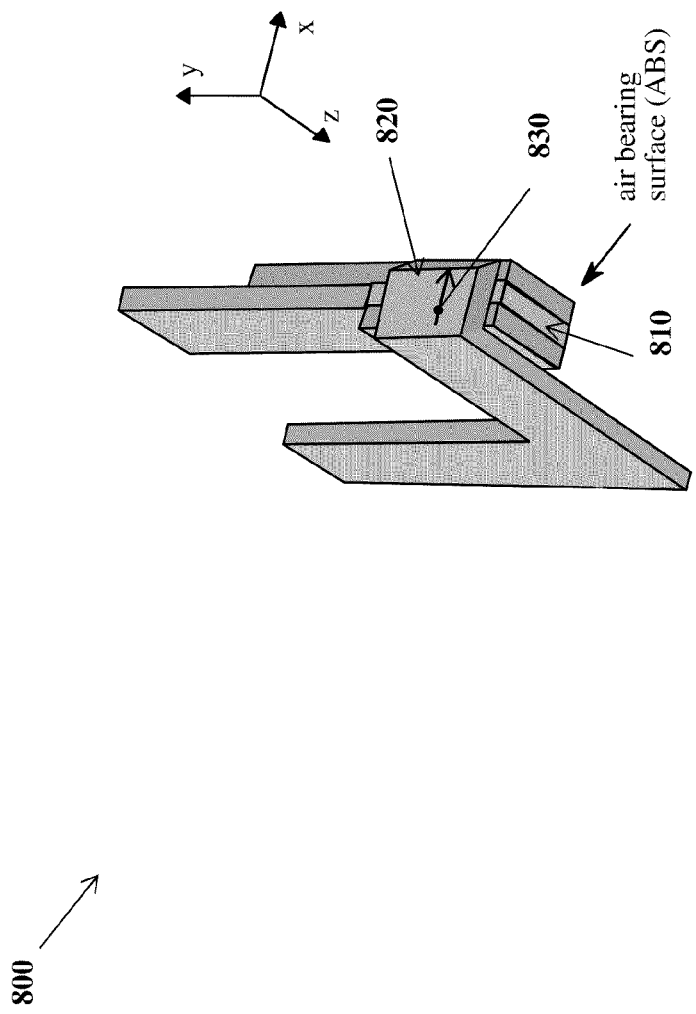
FIG. 8 is an example of a sensor in a read-back head in accordance with an exemplary embodiment of the invention.

Another feature of the novel devices discussed herein is that they provide convenient magnetization orientations. FIG. 8 is an example of a sensor 800 in a read-back head in accordance with an exemplary embodiment of the invention. The perspective sketch shows the air bearing surface (ABS, here the xz plane) with nonmagnetic leads for current and voltage extending upwards along the y axis.

Sensors in prior art read heads are not typically planar devices. By contrast they are fabricated as planar devices and then the device and substrate are mounted on the read head such that the device plane is perpendicular to the ABS, and therefore perpendicular to the plane of the media (which is parallel to the ABS). In the embodiment of the invention depicted in FIG. 8, the film planes of F1 810 and F2 820 are perpendicular to the xz plane. The invention is unique in that the plane of F2 820 is also perpendicular to the plane of F1 810. As a consequence, the magnetization M1 can be pinned, for example along the y axis. Film F2 820 can be fabricated with a uniaxial anisotropy along the x axis, and the magnetization M1 830 is then perpendicular to M2 in the absence of any external magnetic field. Small fields, associated with bits in recorded media, cause M1 to deviate and acquire components along the y axis. These components of magnetization are then sensed as deviations from the quiescent device state. The magnetization versus magnetic field (M-H) characteristic of such a device is more sensitive than that of a device with quiescent state characterized by parallel or anti-parallel orientations. Furthermore, magnetostatic coupling associated with fringe fields is diminished in the new geometry, relative to planar device geometries.

For MRAM applications, another feature of the novel devices discussed herein is an improved write process using domain wall switching. State of the art MRAM prototype cells typically employ spin torque switching for the write process, and such a prototype cell is called ST MRAM. The write operation can be described briefly in the following way for the case of an MTJ based ST MRAM cell. A spin polarized current pulse is driven from the pinned layer to the free layer. The spin polarized current supplies a torque that can orient the magnetization of the free layer. For a free layer with uniaxial anisotropy axis, an orientation that is parallel or anti-parallel with that of the pinned layer can be achieved using a write pulse of electrical positive or negative polarity. The advantages of the spin torque write process include: (i) simpler architecture and smaller cell size, (ii) lower write power, (iii) scalability (write current decreases as feature size decreases), and (iv) improved write margins (fewer write errors). The central disadvantage is that the relatively large write current must be driven across the interface between the pinned and free ferromagnetic layers, and that interface includes a tunnel barrier for the MTJ cell. Since the write current is relatively large and the tunnel barrier resistance is also relatively large, the voltage across the barrier is necessarily large. The tunnel barrier breakdown voltage is a characteristic value that corresponds to catastrophic failure of the device structure, and this value imposes a limit on the magnitude of write current that can be applied. Conversely, the cell may suffer from limited durability when a value of write current magnitude that results in a voltage below the breakdown value is used. The dielectric tunnel barrier may be degraded by the application of repeated write cycles.

Figure 9:
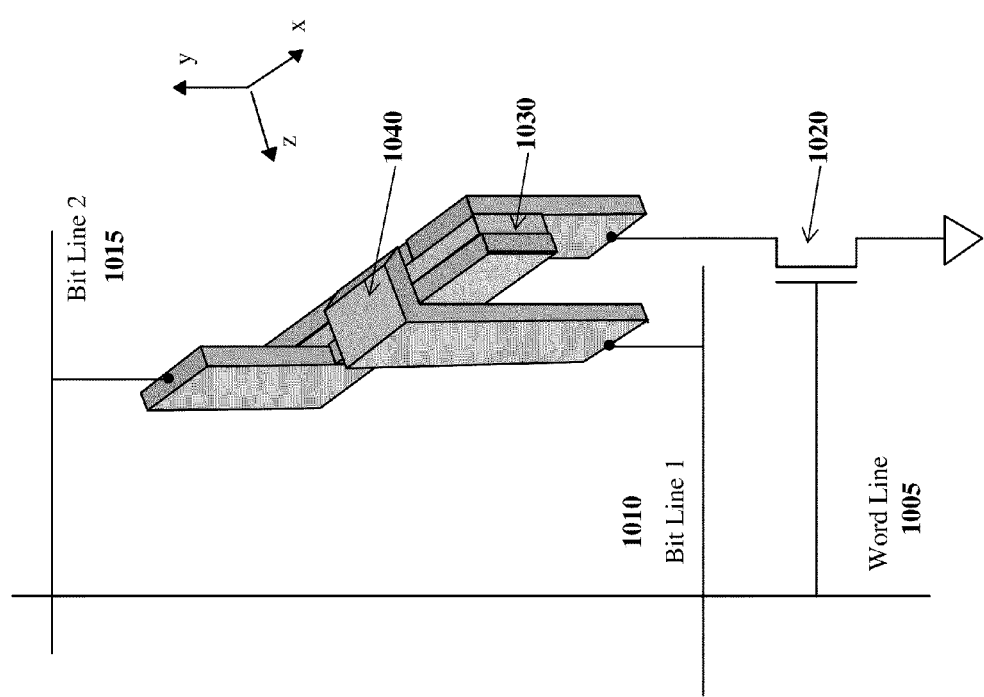
FIG. 9 is a perspective view of an improved write process in accordance with an exemplary embodiment of the invention.

FIG. 9 is a perspective view of an improved write process in accordance with an exemplary embodiment of the invention. The array architecture involves word lines 1005 connecting cells along columns, bit lines 1 1010 that connect cells along rows, and bit lines 2 1015 that run diagonally, connecting cells that are neighbors at corners. In this improved process, a pulse of current is applied from Bit line 2 1015 to ground when the select transistor 1020 is enabled by a voltage from the word line 1005. This electric current pulse represents a spin polarized current in free layer F1 1030, and such a current pulse is capable of moving a domain wall along the length of the patterned F1 layer. The domain wall traversal represents a change of magnetization orientation, in the vicinity of F2 1040, from a state with M1 and M2 parallel to a state with M1 and M2 anti-parallel. The opposite change is achieved using a current pulse of opposite electric polarity. The magnitude of write current for domain wall movement (order of $5\times10^2$ amp/cm$^2$) is comparable with that for spin torque transfer across a F1/F2 interface. However, the write current in the improved geometry of the invention is not driven across the F1/F2 interface and therefore does not cross the tunnel barrier. The integrity of the tunnel barrier is protected, and the barrier breakdown voltage does not impose a limit on the magnitude of write current that can be used.

For CPP spin valves, another feature of the novel devices discussed herein is that an effective cross sectional area of the device is minimized. The magnetoresistance ratio of the CPP spin valve is typically larger than that of the CIP spin valve, but the CPP spin valve is characterized by a relatively low device resistance. Because the magnetoresistance is a ratio, $\Delta R/R$, the magnitude $\Delta R$ of the resistance modulation of the device is small when the device resistance is small. The device resistance is typically inversely proportional with the cross sectional area. The relevant area is that of the interface between F1 and F2, equivalently the area that determines the current density in the device. Planar CPP cells have a cross sectional area determined by the transverse area of the structure. By contrast, the cross sectional are of the CPP spin valve embodiment of the invention is given by the area of the interface between F1 and F2, which is typically determined by the thickness of F1 and the width of either F1 or F2. The CPP spin valve of the invention therefore has a larger resistance and will have a larger resistance modulation $\Delta R$.

For lateral spin valves (LSV), another feature of the novel devices discussed herein is that the device volume is minimized: The output resistance modulation $\Delta R$ of the LSV varies inversely with the active volume of nonmagnetic metal N, and it follows that the optimal device will have minimized volume. The LSV embodiment of the invention provides a minimal volume because F1 and F2 can be located in close proximity, and the N layer can be fabricated with minimal thickness and width. Furthermore, additional tunnel barriers could be used to fabricate N. As an example, these barriers could be fabricated near the right angle bends of N (for example, refer to FIG. 4), and they would function to prevent the nonequilibrium spin accumulation from diffusing into remote parts of N. Instead, the spin accumulation would remain within an active volume determined by the thickness and width of N, along with the height of the materials stack as the third dimension.

It should be understood that the foregoing relates only to illustrative embodiments of the present invention, and that numerous changes may be made therein without departing from the scope and spirit of the invention as defined by the following claims.

The invention claimed is:

1. A magnetoelectronic device comprising:
   a first ferromagnetic thin film element; and
   a second ferromagnetic thin film element joined directly at an edge of the first ferromagnetic thin film element, wherein a bias current is in parallel to a film plane of the first ferromagnetic thin film element, but is substantially perpendicular to a film plane of the second ferromagnetic thin film element.

2. The device of claim 1, wherein the magnetoelectronic device is a spin valve.

3. The device of claim 1, wherein the magnetoelectronic device is a magnetic tunnel junction.

4. The device of claim 1, wherein the magnetoelectronic device is a lateral spin valve.

5. The device of claim 1, wherein the magnetoelectronic device is a sensor in a read head.

6. The device of claim 1, wherein the magnetoelectronic device is a storage element in a nonvolatile magnetic random access memory.

* * * * *